(12) United States Patent
Gerber et al.

(10) Patent No.: US 6,432,761 B1
(45) Date of Patent: Aug. 13, 2002

(54) APPARATUS AND METHOD FOR INDEPENDENT THRESHOLD VOLTAGE CONTROL OF MEMORY CELL AND SELECT GATE IN A SPLIT-EEPROM

(75) Inventors: Don Gerber, Gilbert; Jeff Shields, Chandler; David Suda, Phoenix, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/410,787

(22) Filed: Oct. 1, 1999

(51) Int. Cl.$^7$ .................. H01L 21/8238; H01L 21/8236
(52) U.S. Cl. .................... 438/217; 438/278; 438/289
(58) Field of Search ................. 438/201, 211, 438/217, 257, 266, 276, 278, 289, 291, 301, 420, 519, 527, 532, 142

(56) References Cited

U.S. PATENT DOCUMENTS 6,044,015 A * 3/2000 Van Houdt et al. ..... 365/185.15
6,069,042 A * 5/2000 Chien et al. ................. 438/266
6,103,576 A * 8/2000 Deustcher et al. .......... 438/261

* cited by examiner

Primary Examiner—Michael Trinh
Assistant Examiner—Pamela E. Perkins
(74) Attorney, Agent, or Firm—Baker Botts L.L.P.

(57) ABSTRACT

A split-gate p-channel memory cell of an EEPROM, and method of fabricating the cell, are provided. The memory cell includes a memory transistor and select transistor that share a common gate. It further includes two independent and distinct threshold voltage adjusts implanted in different portions of a channel region of a substrate of the memory cell. One of the threshold voltage adjusts is disposed in relation to the memory transistor so as to influence its threshold voltage. The other threshold voltage adjust is disposed in relation to the selected transistor so as to influence its threshold voltage. In the method of fabrication, an n-type of dopant is implanted into the substrate to form the threshold voltage adjust associated with the memory transistor and a p-type of dopant is implanted into the substrate to form the threshold voltage adjust associated with the select transistor.

8 Claims, 19 Drawing Sheets

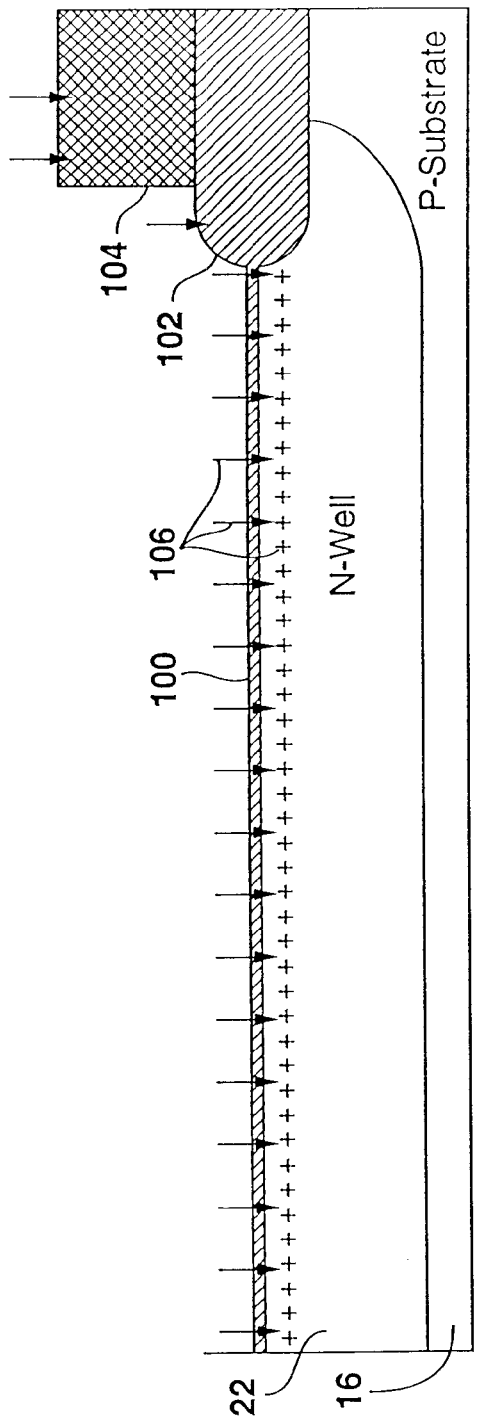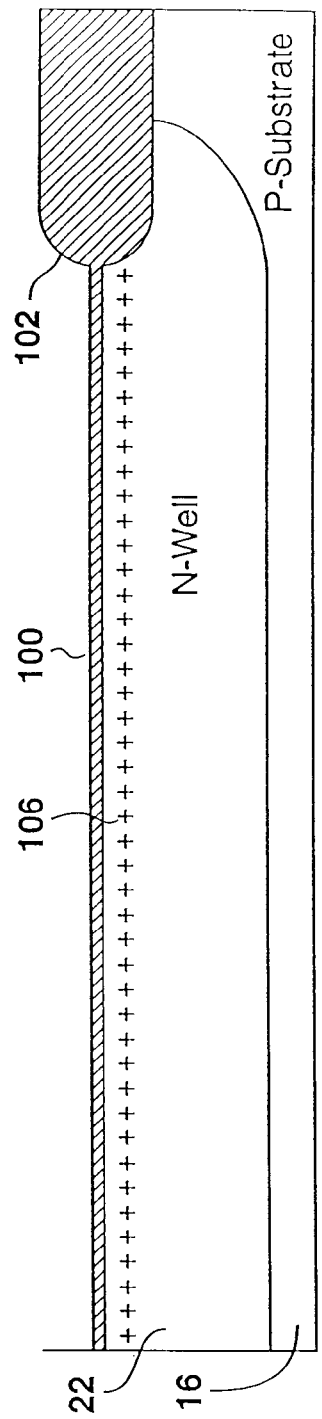
Fig. 8
Fig. 9

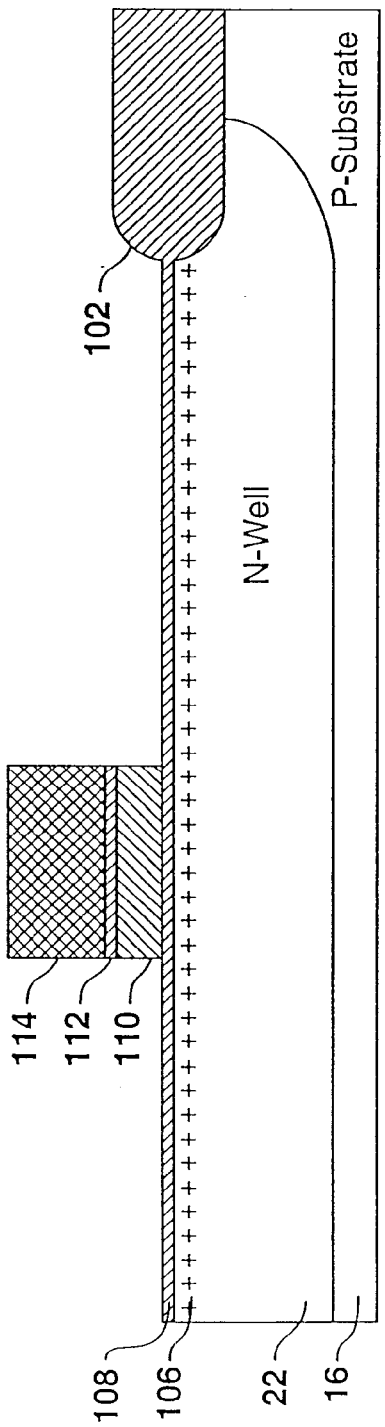
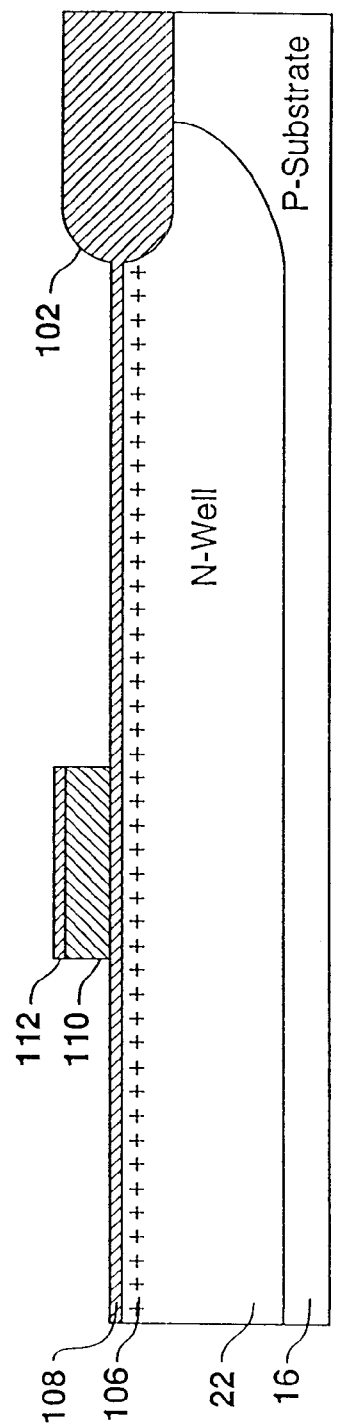

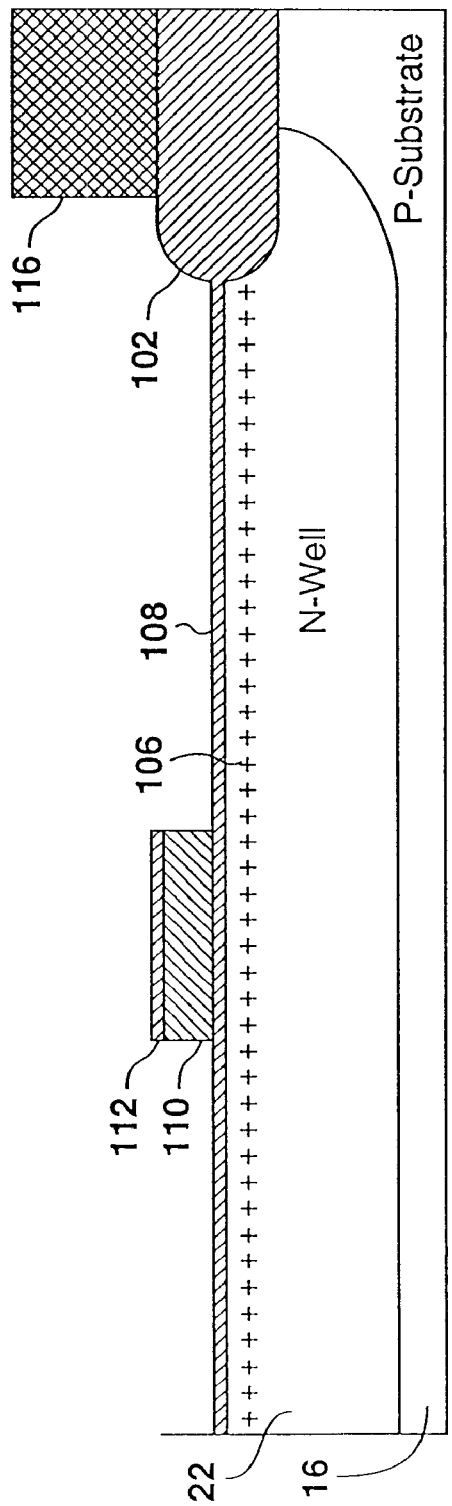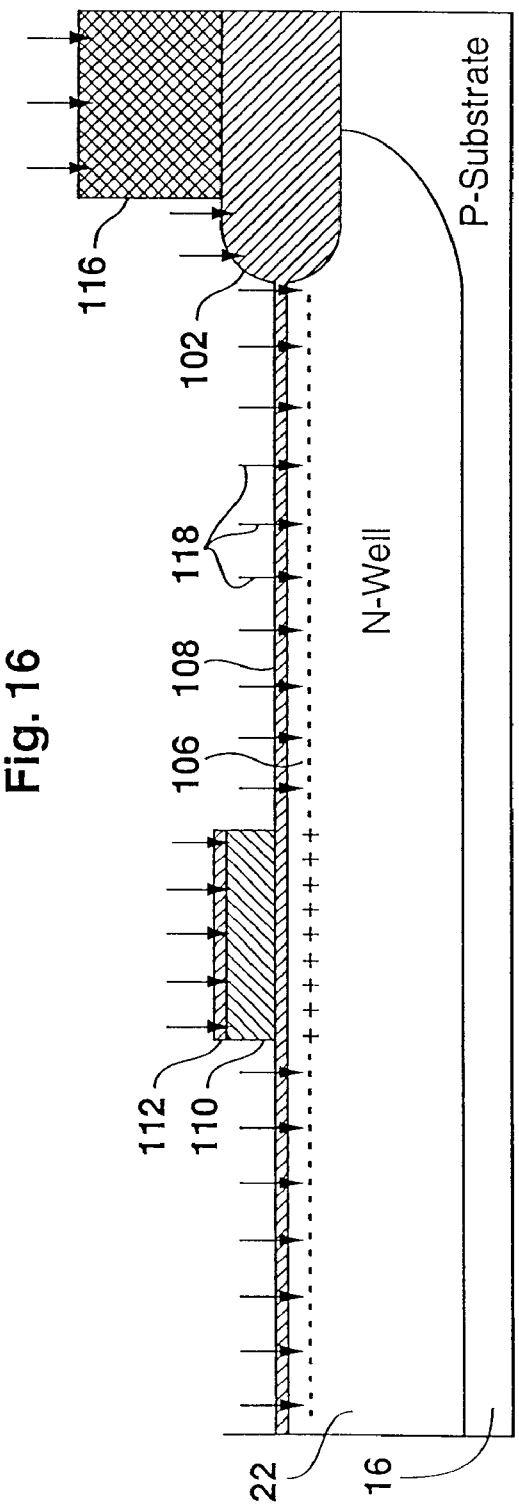

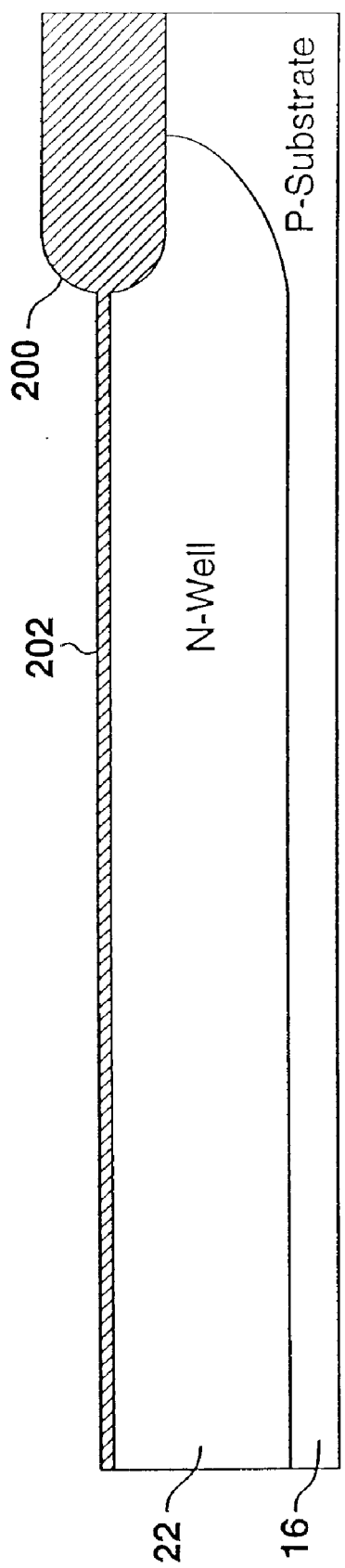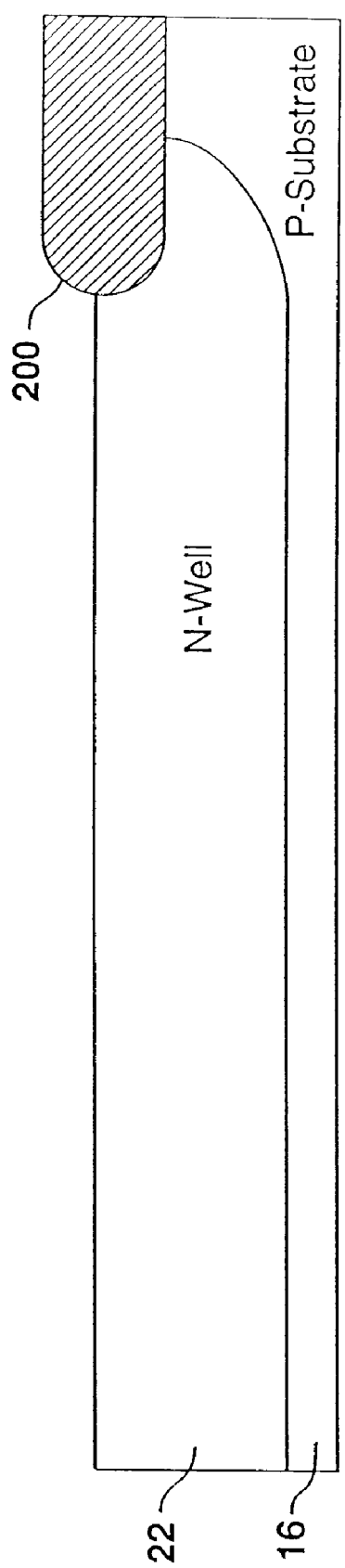
Fig. 19
Fig. 20

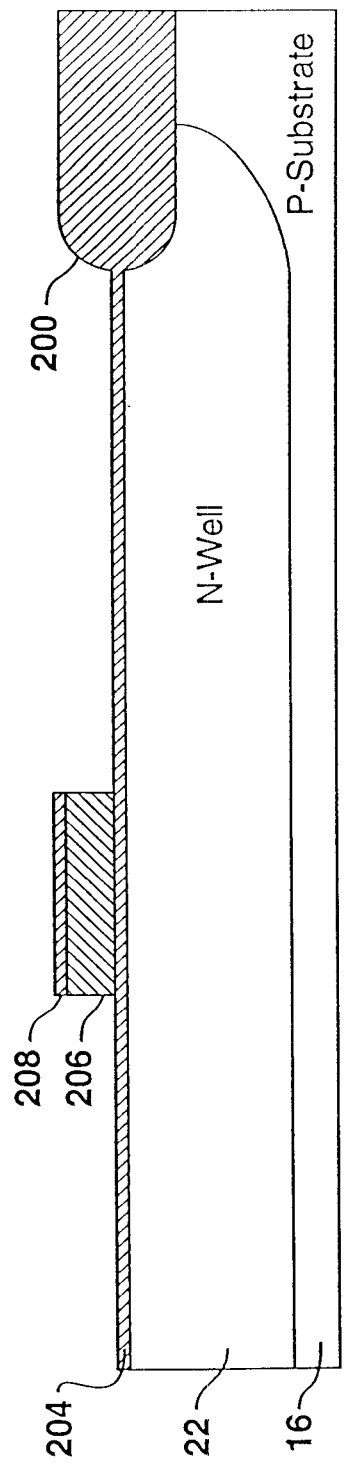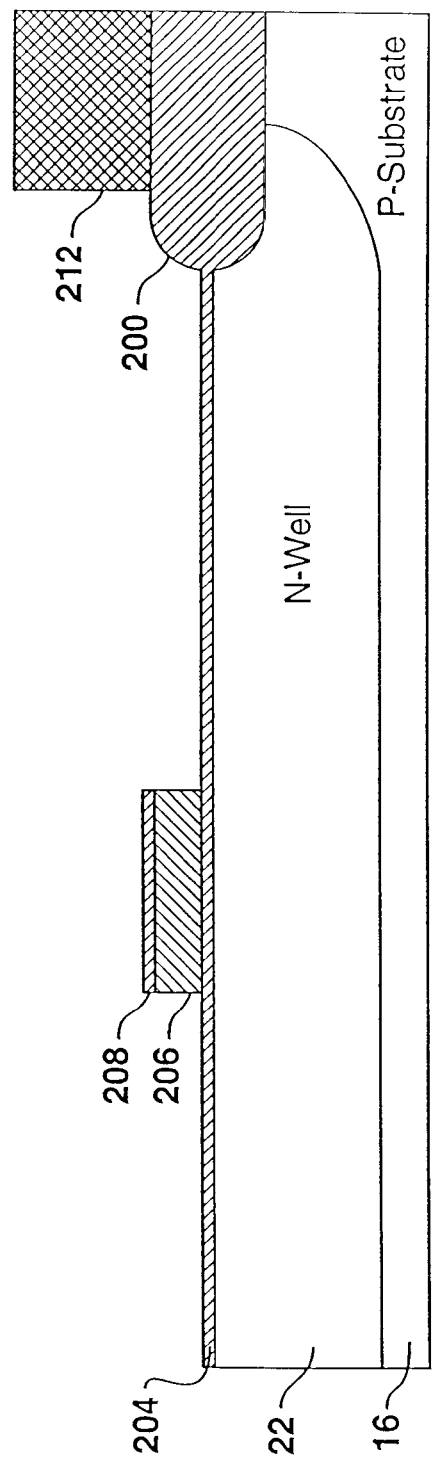

APPARATUS AND METHOD FOR INDEPENDENT THRESHOLD VOLTAGE CONTROL OF MEMORY CELL AND SELECT GATE IN A SPLIT-EEPROM

FIELD OF THE INVENTION

The present invention relates generally to split-gate p-channel Electrically Erasable Programmable Read Only Memory (EEPROM) cells, and more particularly to a split-gate memory cell having select and memory transistors that share an active channel region and have independent and distinct threshold voltage (Vt) adjusts that optimize the programming window of the memory cell.

BACKGROUND OF THE INVENTION

EEPROM memory cells are a class of nonvolatile semiconductor memory in which information may be electronically programmed into and erased from each memory element or cell. Split-gate EEPROM memory cells are one type of EEPROM cell in which the select and memory transistors are merged so that they share the same polysilicon gate, commonly known as the poly 2 or select gate. The poly 2 gate forms both the wordline or gate electrode of the select transistor and the control gate of the memory transistor. This configuration allows for a smaller cell size and thus provides a more efficient design.

Information is stored in split-gate EEPROM memory cells by placing electronic charge on a "floating gate", which is typically a region of conductive polysilicon (commonly known as poly 1) that is electrically isolated from other conducting regions of the device by insulating dielectric layers that surround it. The charge on the floating gate can be detected in reading the memory cell because it changes the threshold voltage of the memory transistor. This change in threshold voltage changes the amount of current that flows through the cell when voltages are applied to it during the read operation and the current can be detected by a sense amplifier circuit.

In a typical EEPROM design, n-channel cells are produced over a p-well substrate. In U.S. Pat. No. 5,790,455 entitled "Low Voltage Single Supply CMOS Electrically Erasable Read-Only Memory", which is issued to Caywood and licensed to the assignee of the present application and incorporated herein by reference, however, the opposite configuration is described, namely, p-channel devices over an n-well, which itself resides in a p-type substrate. The advantage of this configuration is that it reduces the magnitude of the applied voltage required for erasing and writing to the device, while maintaining a similar writing speed as compared to the prior art. This configuration also eliminates certain components functionally necessary in the prior art.

Referring to FIG. 1, the Caywood approach is illustrated in general terms for a single memory transistor 1. The n-well 3 is created within a p-type substrate 2 and the p-type diffusion regions for the source 4 and drain 5 is created within the n-well 3. Thus, in this design, the select and memory transistors share a common active channel region. The poly 1 or floating gate 6 of the memory transistor 1 is created after the active region for the source 4 and drain 5. The poly 2 or select gate 7 of the memory transistor 1 is fabricated over the floating gate 6. Various non-conductive layers 8 (not shown) insulate the source 4 and drain 5, the floating gate 6 and the select gate 7 from each other.

In the Caywood approach and other prior p-channel designs, the channels of both the memory cell and select transistors are embedded with the same threshold voltage adjust implants or adjusts. The threshold voltage adjust in these devices is used to set the threshold voltage of the select transistor to its desired value. The threshold voltage of the memory transistor, however, is not set to any value, but rather assumes a "natural" Vt value (zero charge on the floating gate). The drawback of this solution is that when the p-channel memory transistor is "programmed" into the conductive state, its threshold voltage can be much more positive than the select transistor. In this case, the threshold voltage of the select transistor alone controls the combined threshold voltage of the memory transistor and select transistor. Thus, part of the threshold window (Vt window) of the cell, i.e., the difference between the threshold voltages of the cell in the programmed (Vtw) and the erased (Vte) states, is lost.

For example, the memory cell transistor alone might have a programmed Vt of +3.0 V (volts) and an erased Vt of −5.0 V, while the select transistor would typically have its Vt set at −0.8 V. The overall threshold window of the memory cell and select gate would be from −0.8 V to −5.0 V, and not the threshold window of the memory cell alone which is from +3.0 V to −5.0 V. The part of the threshold window from +3.0 V to −0.8 V is lost. The disadvantage of this is that it reduces the working life of the memory cell.

In particular, the Vt window of a cell changes with the number of program and erase cycles that it undergoes. The Vt window typically collapses with increasing program/erase cycles due to electron trapping in the tunnel oxide. FIG. 2 illustrates for a p-channel split-gate EEPROM cell how the Vt window decreases with cycles. The solid lines for Vtw and Vte indicate the average values of the thresholds of a large population of cells. The dashed lines on either side indicate the spread in Vtw and Vte due to processing variations. In addition to the process variations and Vt window collapse with program/erase cycling, some loss of charge with time from an erased or written cell must also be accounted for. This is indicated as an inner pair of dotted lines, which reduces the minimum Vt window even more. The minimum Vt window at any given number of cycles is taken inside the dotted line envelope. Beyond all of this, there are still other effects, such as a sense amplifier trip point variations and variations due to operation over a range of temperatures, that require that the VT window be made even wider.

There are a number of ways of increasing the Vt window, but they all have drawbacks. For example, the Vt window can be made wider by using a larger programming voltage, Vpp. However, if Vpp is increased, then the tunnel oxide is subjected to a larger electric field stress in each program/erase cycle and the Vt window collapse with cycling becomes worse. The Vt window can also be made wider by making the tunnel oxide thinner. However, making the tunnel oxide thinner, makes it more likely that charge stored on the floating gate will leak off over time after the tunnel oxide has been stressed with program/erase cycles. This effect is known as stress-induced leakage current (SILC). The Vt window can further be widened by increasing the coupling ratio of the cell. An increase in the coupling ratio of the cell is possible only by either increasing the silicon chip area consumed by the cell or by decreasing the inter-poly dielectric thickness. It is not desirable to increase the silicon chip area for obvious reasons, and decreasing the interpoly dielectric can also reduce the ability of the cell to retain charge, as well as make it more difficult to manufacture the cell in a high yielding process.

Accordingly, it is desirable to optimize the programming window of the memory cells in a p-channel split-gate EEPROM without any of the drawbacks associated with the solutions mentioned above.

SUMMARY OF THE INVENTION

In one aspect of the present invention, a split-gate EEPROM memory cell is provided. The memory cell includes a memory transistor and select transistor that share a common gate. The memory cell further includes two independent and distinct threshold voltage adjusts implanted in different portions of a channel region of substrate of the memory cell. One of the threshold voltage adjusts is disposed in relation to the memory transistor so as to influence its threshold voltage. The other threshold voltage adjust is disposed in relation to the select transistor so as to influence its threshold voltage. In the preferred embodiment of the present invention the threshold voltage adjust associated with the memory transistor is formed of an n-type dopant, preferably Arsenic or Phosphorus. In this embodiment, the threshold voltage adjust associated with the select transistor is formed of a p-type dopant, preferably Boron or $BF_2$.

In another aspect of the present invention, a method of fabricating a split-gate memory cell is provided. The method includes the step of implanting a threshold voltage adjust associated with the memory transistor in a channel region of a substrate of the memory cell. The method further includes the step of implanting a threshold voltage adjust associated with the select transistor in a different portion of the channel region of the cell substrate. In the preferred method, the threshold voltage adjust associated with the memory transistor is formed by implanting an n-type dopant into the channel region of the substrate. In this method, the threshold voltage adjust associated with the select transistor is formed by implanting a p-type dopant into the channel region of the substrate. During this step, implantation of the p-type dopant in the portion of the channel region associated with the memory transistor is prevented by the floating gate, which acts as a self-aligning mask.

In one embodiment of the invention, the step of implanting the n-type of dopant is performed before the floating gate is formed. In another embodiment, this step is performed after the floating gate is formed.

The use of independent and distinct threshold voltage adjusts widens the threshold voltage window of the memory transistor and select transistor, and thus extends the operational life of the memory cell.

BRIEF DESCRIPTION OF THE DRAWINGS

Other objects and advantages of the invention will become apparent upon reading the following detailed description and upon reference to the drawings in which:

FIGS. 6–18 illustrate the process steps that are performed in carrying out one method of forming separate threshold voltage adjust implants for the memory transistor and the select transistor according to the present invention;

FIGS. 19–29 illustrate the process steps that are performed in carrying out another method of forming separate threshold voltage adjust implants for the memory transistor and the select transistor according to the present invention.

Figure 1:
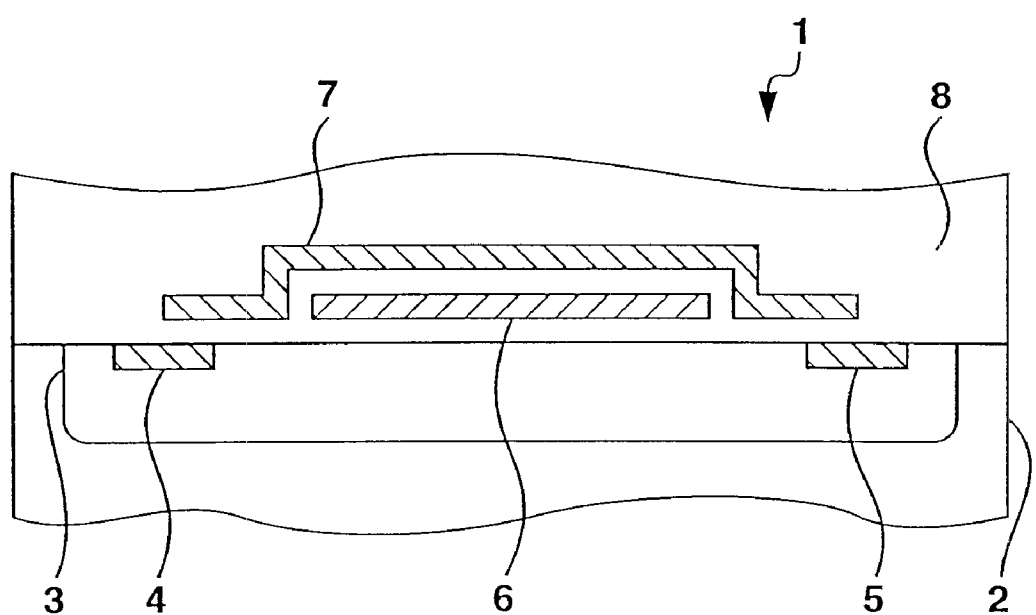
FIG. 1 is cross-sectional view of a prior art memory cell in a p-channel split-gate EEPROM.
Figure 2:
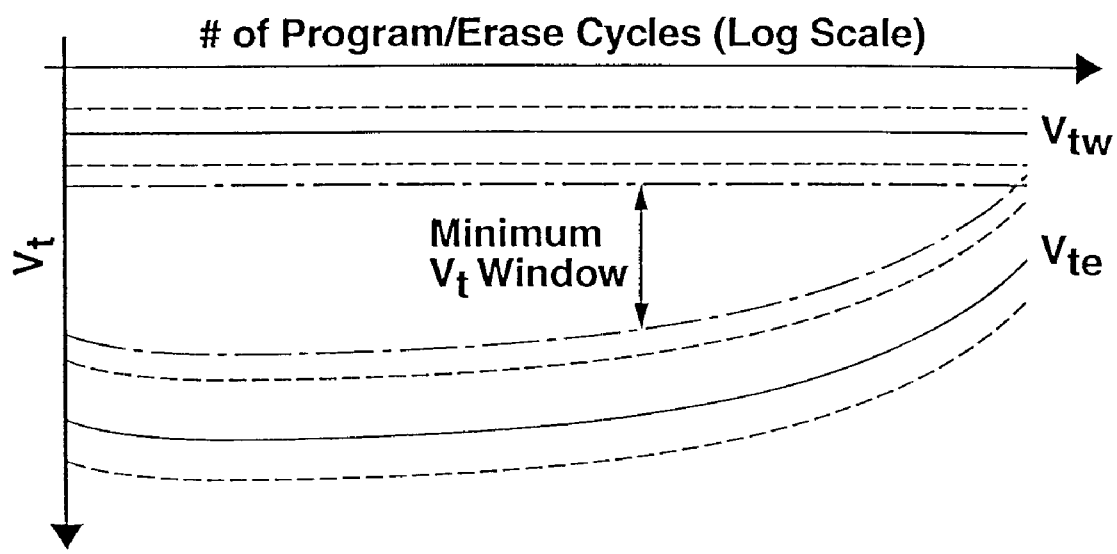
FIG. 2 is a graph of the threshold voltage of a memory cell in the programmed and erased states as a function of the number of program/erase cycles that the cell undergoes.

While the present invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE PREFERRED EMBODIMENTS

Figure 3:
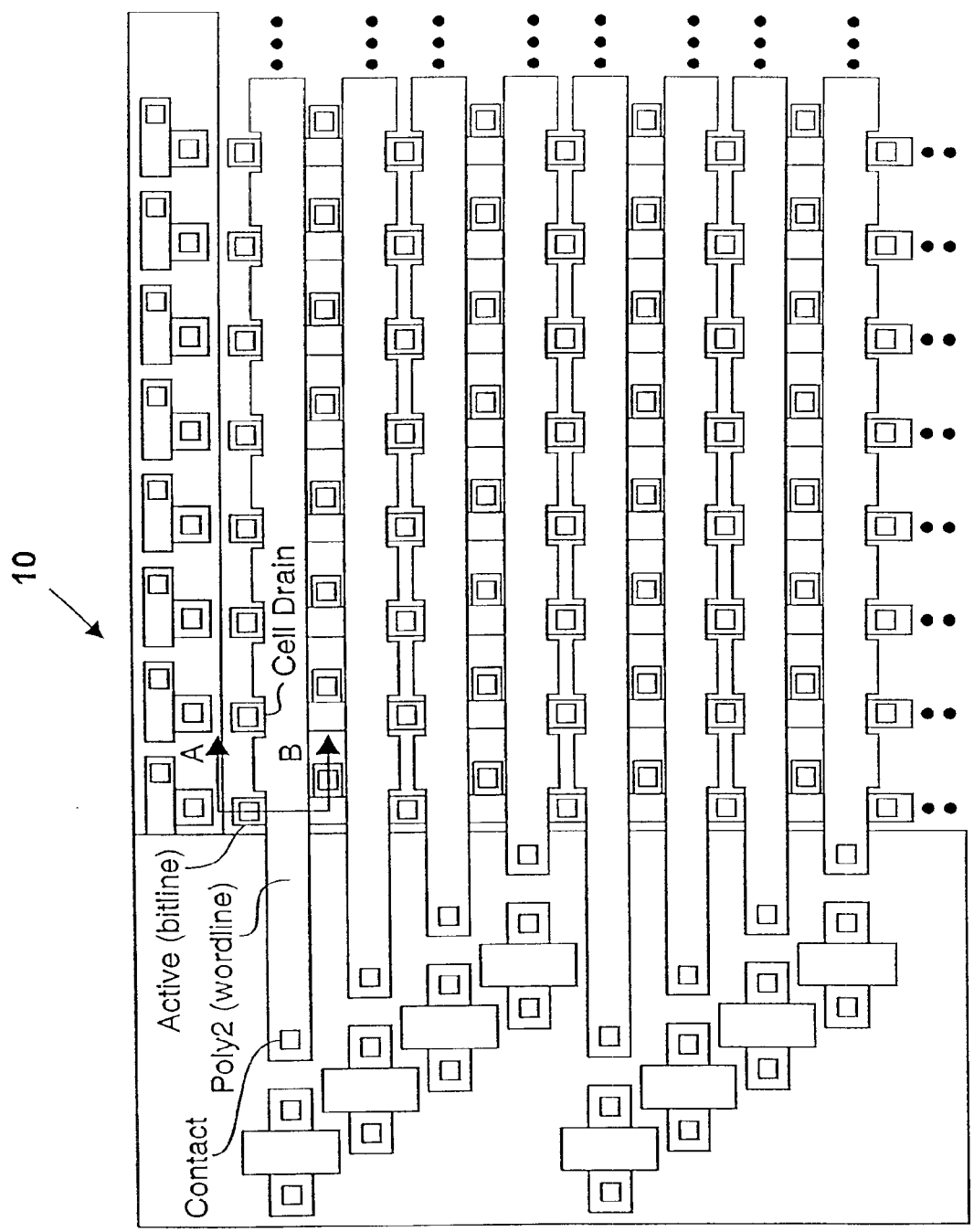
FIG. 3 is a plan view of a portion of memory cell array of a p-channel split-gate EEPROM according to the present invention.

Turning to the drawings, the preferred embodiments of the present invention will now be described. Referring initially to FIG. 3, a portion of a memory cell array 10 according to the present invention, the upper left-hand corner, is shown. The figure shows 8 columns (8 bitlines) of cells running vertically and 8 rows (8 wordlines) of cells running horizontally. To the right and below this portion of the memory cell, many additional columns and rows that form the rest of the array are indicated. To the left and above the portion of the memory cells shown is the peripheral circuitry, which is used to access the memory array and perform other chip functions. For ease of illustration, the present invention will be described with reference to a single memory cell, which is shown in FIG. 4, which is a cross-sectional view of the memory cell in the upper left-hand corner of the array 10 through line A–B.

Figure 4:
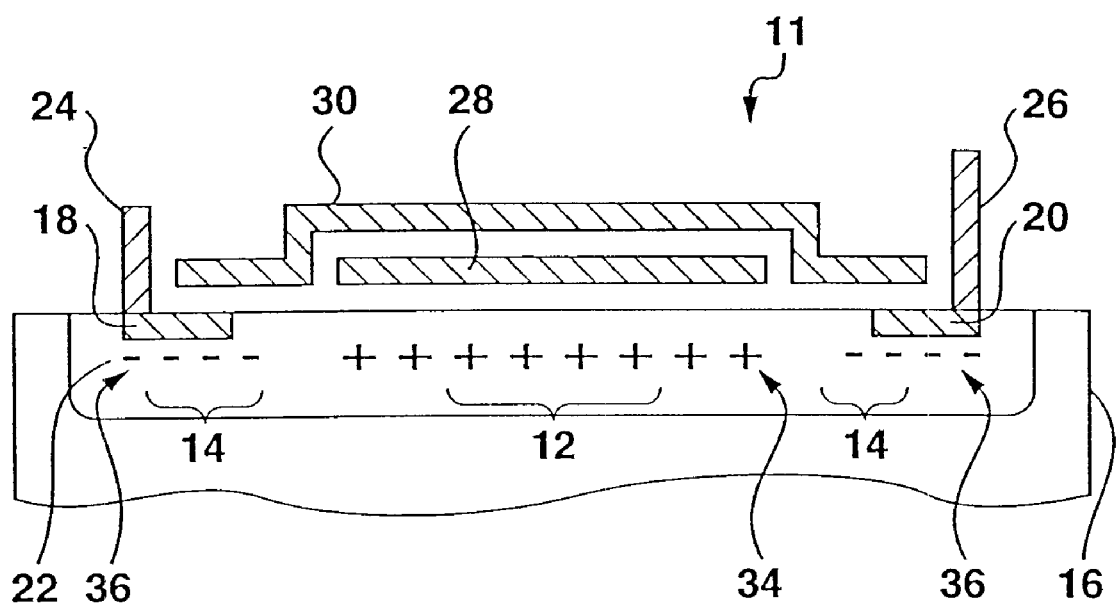
FIG. 4 is a cross-sectional view taken along line A–B of the memory cell in the upper-left hand corner of memory cell array shown in FIG. 3.

With reference to FIG. 4, the single memory cell according to the present invention is illustrated generally by reference numeral 11. The memory cell 11 includes a memory transistor 12 and select transistor 14 formed on a p-type silicon substrate 16. The memory cell 11 resides in an n-well 22, which in turn is formed in the substrate 16. The substrate 16 has p-type diffusions regions, which form a source 18 and drain 20. Reference numeral 24 refers to the metal source contact, which is disposed on p-type region 18 and reference numeral 26 refers to the metal bitline (drain) contact, which is disposed on p-type region 20. The memory transistor 12 includes a floating gate 28, which is a conductive layer, and a select gate 30, which is a conductive layer shared with the wordline of the select transistor 14.

The memory cell 11 further includes separate threshold voltage adjusts 34 and 36 for the memory transistor 12 and the select transistor 14, respectively. The threshold adjust implant 34 is an n-type dopant and is preferably Arsenic ($_{75}As^+$) or Phosphorus ($_{31}P^+$). The threshold voltage adjust 36 is a p-type dopant and is preferably Boron ($_{11}B^+$) or $BF_2^+$. The advantage of the n-type dopant is that it has the effect of reclaiming the lost threshold voltage window, which results from the merged cell construction. This implant shifts the threshold of the memory transistor 12 in the negative direction for both programmed and erased states. For example, with an implant of Arsenic at a dose of $1.0 \times 10^{13}$ $cm^{-2}$ (per centimeter squared) in the cell channel only, the programmed Vt of the cell alone might be shifted to 0.0V (a shift of 3V in the negative direction) and the erased Vt would be shifted by the same amount to −8.0V. The threshold window of the memory transistor 12 and the select transistor 14 together would then be from −0.8V to −8.0V, giving an increase of 3V in the threshold window of the cell (window= |Vte−Vtw|). It is critical that the select transistor 14 Vt is not shifted negatively along with the memory transistor 12 because then the entire Vt window could be shifted negatively without becoming any wider. Having the two threshold voltage adjusts independent of one another prevents this from happening.

Figure 5:
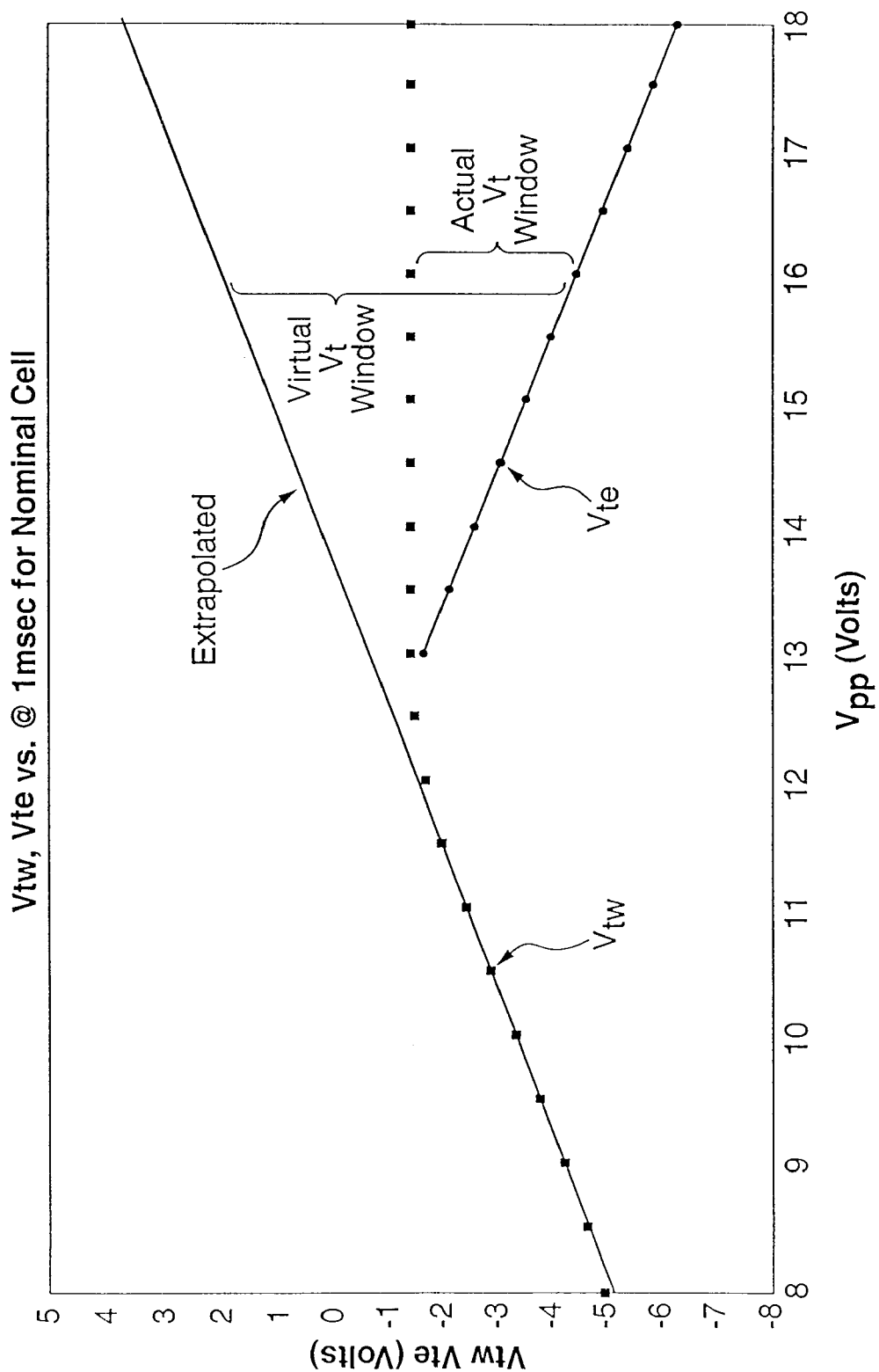
FIG. 5 is a graph illustrating the write and erase threshold voltages (Vt) of the split-gate EEPROM according to the present invention as a function of program voltage (Vpp)

Graphs of the threshold voltage in the erased state, Vte, and the threshold voltage in the programmed state, Vtw, as a function of the program voltage Vpp of the memory cell 11 is shown in FIG. 5. In the drawing, two curves are illustrated, one that indicates the dependence of Vte on Vpp (the Vte-Vpp Curve) and one that indicates the dependence of Vtw on Vpp (the Vtw-Vpp Curve). With respect to the Vte-Vpp Curve, each value of Vte is obtained by first programming the cell into a written state with Vpp=16V, and then erasing the cell with a different value of Vpp. It can be seen that as Vpp increases, Vte becomes increasingly negative. In fact, for every 1-Volt increase in Vpp, Vte becomes approximately 1-Volt more negative. The erased threshold voltage, Vte, is measured in the following manner. In the erased state, the overall threshold of the select transistor plus cell transistor is controlled by the threshold of the cell transistor, because it is much more negative than the select transistor. As the voltage, Vg, on the shared polysilicon gate of the two transistors is swept from 0-Volts to larger negative values, the select transistor first turns on (at, for example, Vg=−1.3V), but no current, Id, flows because the cell transistor has not been turned on. Eventually, the Vg reaches a large enough negative value that the cell transistor turns on and, finally, current flows because both transistors are on together. The gate voltage at which the current, Id, reaches a value of 1-microampere ($\mu$A) is considered the threshold voltage in the erased state, Vg=Vte.

With respect to the Vtw-Vpp Curve, each value of Vtw is obtained by first erasing the cell with Vpp=16V. Then, from this erased state, the cell is programmed to a written state with a different value of Vpp. It can be seen that at low values of Vpp, Vtw increases by approximately 1-Volt for every 1-Volt increase in Vpp, but only up to a point. At about Vpp=12V, the curve starts to level off at a value of Vtw~−1.0V to −1.5V, and remains at this value as Vpp increases further. At this point, the select transistor has a more negative Vt than the cell transistor. Thus, in this situation, it is the select transistor that controls the activatation or "turn on" of the two-transistor combination. (The line through the Vtw data points is an extrapolation of the Vtw curve from the linearly increasing portion to indicate that the threshold of the cell transistor alone is becoming increasingly positive, but it is not possible to measure its individual Vt, because the select transistor is in series with it and controls the overall threshold.)

FIG. 5 also illustrates the Vt window that is actually obtained and a so-called "virtual" Vt window. The "virtual" Vt window is the Vt window that would be obtained if the select transistor were not limiting the written state threshold. In the present invention, the sloped portions of the Vte-Vpp and Vtw-Vpp Curves, which is where the cell transistor controls the overall threshold, are made to shift downward, while the flat part of the Vtw-Vpp curve, which is controlled by the Vt of the select transistor alone, is held constant, which is preferably at between −0.5V and −2.0V. The fabrication process according to the present invention allows the thresholds of the cell transistor and select transistor to be adjusted independently, allowing the flat part of the Vtw-Vpp curve to remain stationary, while the sloped parts of both curves are shifted downward. This has the overall effect of making the actual Vt window wider for a given value of Vpp.

Two alternate methods of fabricating the memory cell 11 shown in FIG. 4 will now be described. In one of the methods, two photoresist masking steps are used, in the other method, only one photoresist masking step is used. The first method is illustrated with reference to FIGS. 6–18, and the second method is illustrated with reference to FIGS. 19–29.

Figure 6:
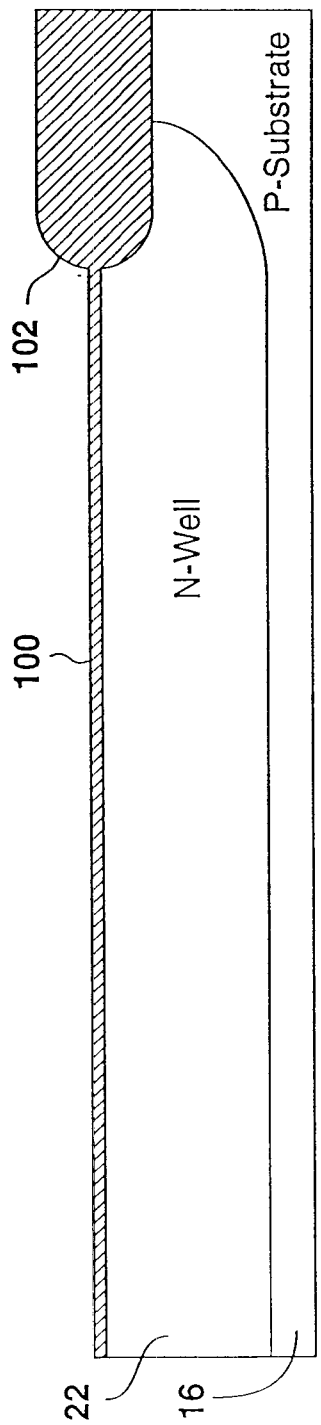
Figure 7:
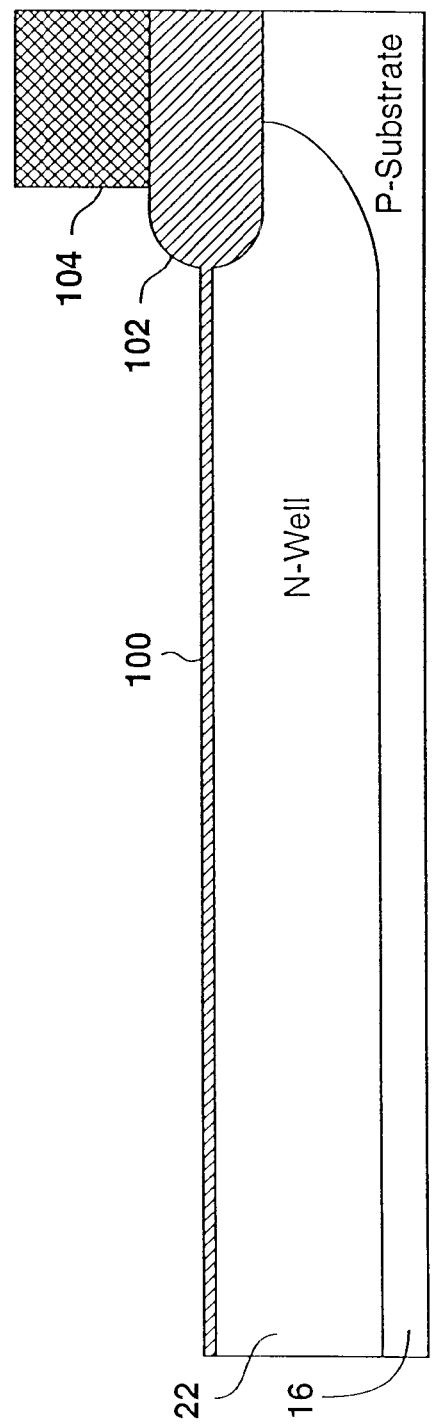

After other steps in the process of manufacturing the memory cell 11 have been performed, such as n-well formation, device isolation, and field oxide growth, which do not form a part of the present invention, the threshold adjust implant 34 for the memory transistor is formed. This phase in the fabrication process proceeds in one method according to the present invention depicted in FIG. 6–18. First, a sacrificial oxide, such as a $SiO_2$ layer 100 is formed on the n-well 22 of the substrate 16 adjacent to a field $SiO_2$ layer 102, as shown in FIG. 6. Preferably, the $SiO_2$ layer 100 is formed at a thickness in the range of 50–500 A (angstroms). The sacrificial $SiO_2$ layer 100 may be formed by thermally growing the layer (not shown), or depositing it, or by any other method known in the art. Next, a photoresist layer 104 is patterned with a mask that exposes n-well 22 over the silicon substrate 16, as shown in FIG. 7. With reference to FIG. 3, the photoresist layer 104 remains over the peripheral circuitry, but is not present over at least a portion of the memory array 10.

Figure 10:
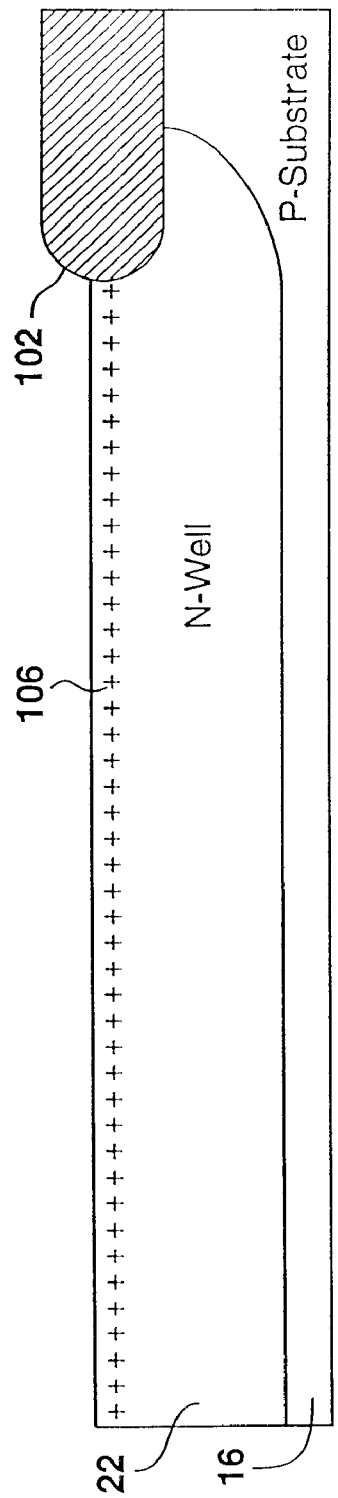

Next, an n-type dopant 106 is implanted into the near-surface region of the n-well 22, using an atomic beam, known conventionally as an ion implanter, as shown in FIG. 8. The n-type dopant that is implanted in this step augments the concentration of n-type dopant already in the n-well. When the n-type dopants are incorporated on lattice sites in the silicon substrate they give up an extra electron, and thus leave behind a singly ionized positive ion core. For this reason, the implanted region is indicated with "+" signs. Examples of n-type dopants that may be used are Arsenic and Phosphorus. The implant dose is preferably in the range of 0 to $5.0 \times 10^{14}$ $cm^{-2}$. The implant energy needs to be enough to allow the implanted ions to get through the sacrificial $SiO_2$ layer 100. As those of ordinary skill in the art will appreciate, other methods may be used to implant the n-type dopant 106. The precise method of implanting the n-type dopant 106 is not critical to the present invention. The photoresist layer 104 is then removed by a dry plasma or wet chemical etching process or other equivalent process known in the art, as shown in FIG. 9. Next, the sacrificial $SiO_2$ layer 100 is removed by a wet chemical etch or other equivalent process known in the art, as shown in FIG. 10.

Figure 11:
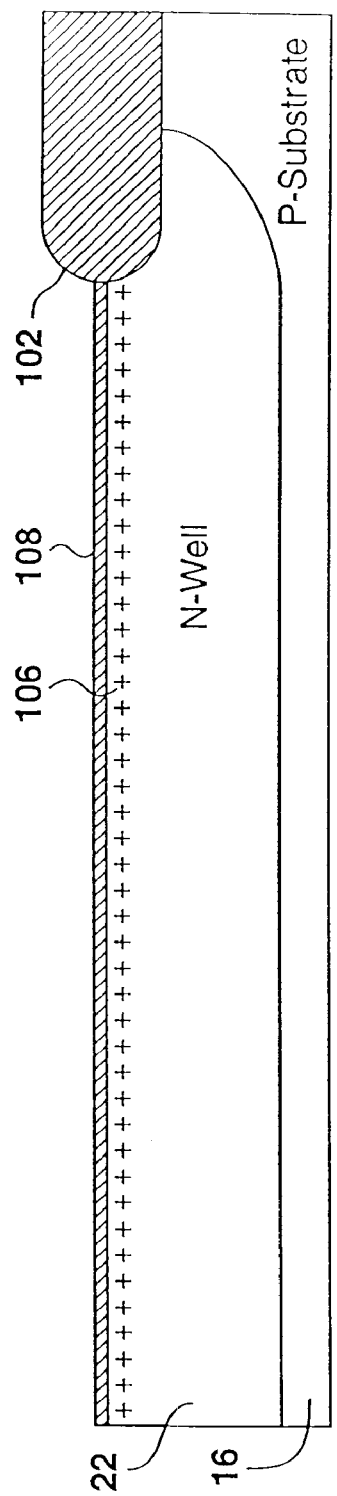
Figure 12:
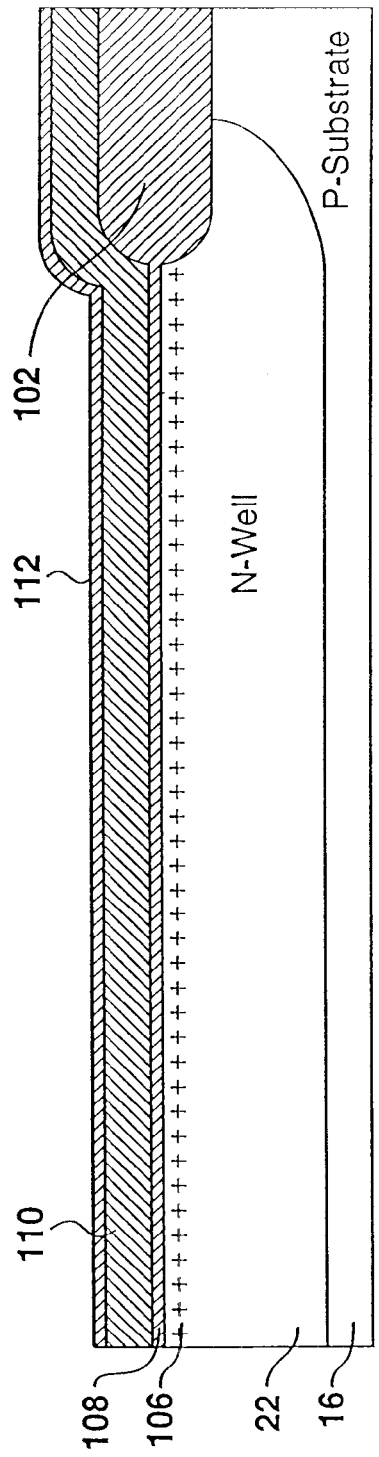

In the next phase of the process, the tunnel dielectric (gate oxide of the memory transistor) and the floating gate 28 are formed. These steps proceed as follows. First, the tunnel dielectric layer 108 is formed on the channel region of the memory transistor 12/select transistor 14, as shown in FIG. 11. As those of ordinary skill in the art will appreciate, the layer 108 preferably has a thickness in the range of 60–120 A. Next, the floating gate 28 is formed by depositing a polysilicon layer 110 on the tunnel dielectric 108, as shown in FIG. 12. Preferably the polysilicon layer 110 is between approximately 600 and 5000 A thick, and more preferably is approximately 1500 A thick. Next, the polysilicon layer 110 is doped to make the layer conductive. In this step, preferably n- or p-type dopants are introduced into the polysilicon layer. This may be accomplished by either annealing the layer in a Phosphorus oxychloride ($POCL_3$) gas, by doping the polysilicon layer in-situ when deposited, i.e., during the depositing step, or by implantation. As those of ordinary skill in the art will appreciate, other methods may be used to dope the polysilicon layer. Next, a dielectric layer 112 is formed over the polysilicon layer 110. The dielectric layer 112 may be formed of one or more layers of material known in the art.

Figure 13:
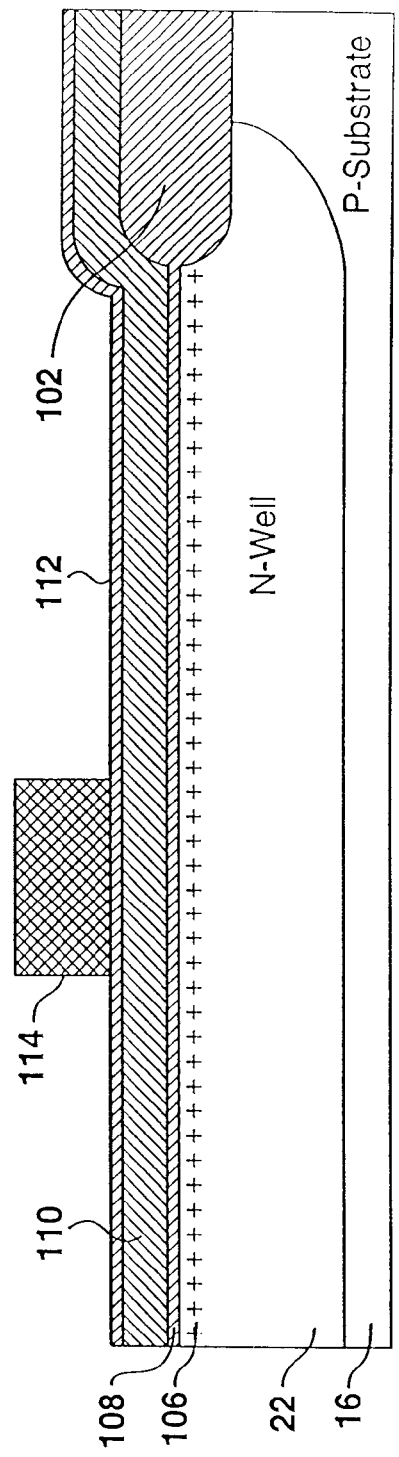

Next, a photoresist layer 114 is deposited on the stack of layers formed, as shown in FIG. 13. The photoresist layer 114 is patterned with a mask and used to define the floating gate 28 (FIG. 4). The stack of layers is then anisotropically etched, preferably using a dry plasma process, down to the tunnel dielectric 108, so as to leave at least a portion of the $SiO_2$ layer 108 on the channel region, as shown in FIG. 14. The photoresist layer 114 protects the floating gate 28 areas during etching. The photoresist layer 114 is then removed by a dry plasma or wet chemical etching process, thus leaving a floating gate pattern 28, as shown in FIG. 15.

In the next phase of the process, the threshold voltage adjust implant 36 (FIG. 4) is formed. This is accomplished first by depositing a photoresist layer 116 over the peripheral circuitry. A portion or all of the memory array 10, including at least some and possibly all of the individual memory cells 11, however, is not masked by the photoresist layer 116 during this step, as shown in FIGS. 3 and 16. Next, a p-type dopant 118 is implanted in the surface region of the n-well 22. The p-type dopant 118 compensates or more than compensates for the n-type dopant 106 that was previously implanted. Furthermore, since p-type dopants accept an extra electron when they are incorporated into lattice sites in the silicon, they have a net negative charge. Thus, the implanted region is indicated in the drawings with a "−" sign. The implantation step is preferably performed as described above using an ion implanter. The p-type dopant is preferably Boron ($_{11}$B+) or $BF_2$ and is preferably implanted at a dose of 0 to $5.0 \times 10^{14}$ cm$^{-2}$. Furthermore, the energy of the implanted ions needs to be large enough to allow them to penetrate the tunnel dielectric 108.

Figure 18:
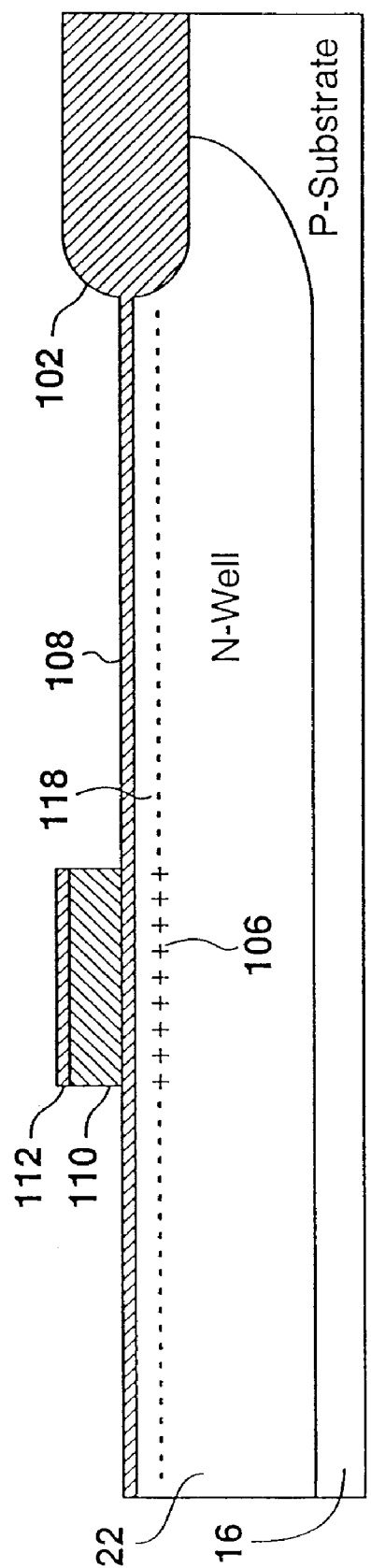

The floating gate 110 (28 in FIG. 4) blocks implantation of the p-type dopant 118 into the part of the memory transistor part of the channel, and thus acts as a mask separating the p-type dopant from the n-type dopant. The advantage of using the floating gate 110 as the mask is that it auto-aligns the implants, and thus avoids any misalignment that may occur if a separate photoresist layer were used. Thus, the memory transistor 12 and select transistor 14 threshold voltage adjust implants 34 and 36 are independent and distinct, one being an n-type, and the other being a p-type, respectively, and self-aligned. Next, the photoresist layer 116 is removed by a dry plasma or wet chemical process, as shown in FIG. 18.

The shared gate electrode or select gate of the select and memory transistors 30, source and drain regions 18 and 20 of the memory cell 11 (FIG. 4), and metal interconnect are then all formed using techniques well known in the art. Indeed, the exact steps in forming these latter components are not critical to the present invention.

In an alternate method the threshold voltage adjust implants 34 and 36 are formed using only one photoresist masking step rather than two. This is done to reduce the process cost. In this alternate method, the n-type dopants are not implanted into the channel region before the polysilicon layer making up the floating gate 28 is deposited and patterned. Rather, after the floating gate 28 is patterned, a new photoresist mask is applied and two implants are done in succession. The memory cell or transistor implant 34 may be done first using an n-type of dopant (e.g., P or As) at an energy level that is high enough to completely penetrate the polysilicon layer making up the floating gate and the tunnel oxide layers. In this case, the n-type dopant enters the cell channel near the surface to shift cell Vt, but goes very deep into the silicon outside of the polysilicon layer making up the floating gate 28 where the select transistor 14 channel is located. A second p-type dopant (e.g., B or $BF_2$) is then implanted with the photoresist mask still in place. This implant is done at a low energy so that it is blocked by the polysilicon layer over the memory cell channel region, but goes into the surface of the select transistor 14 channel to adjust its Vt. It should be appreciated by those of ordinary skill in the art, however, the exact order in which the dopants are implanted is not critical, i.e., the p-type of dopant may be implanted before the n-type of dopant. An advantage of this method is that there is a reduced process cost, since one less photoresist masking step, and one less photoresist strip, has to be performed. Another advantage of this method is that the implants are subjected to less fabrication steps at high temperatures, which makes them redistribute less due to diffusion, and thus makes them more effective in controlling the thresholds. Yet, another advantage of this method is that the deep n-type dopant implanted in the select transistor 14 channel region acts as a deep punch-through suppression implant for the select transistor 14, which helps it to shut off current flow more ideally when the cell is deselected.

Figure 21:
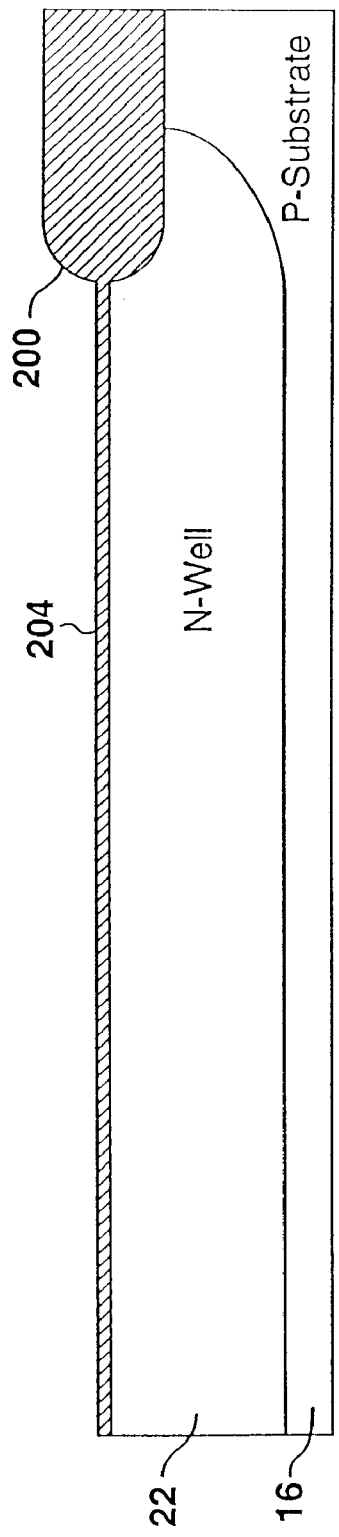

The steps of the alternate method will now be described in more detail with reference to FIGS. 19–29. After the preliminary steps such as n-well formation, device isolation, field oxide 200 growth, and sacrificial $SiO_2$ layer 202 formation are performed, which are shown in FIG. 19, the sacrificial $SiO_2$ layer 202, which is approximately 50–500 A thick, is removed by a wet chemical etch process, as shown in FIG. 20. Next, a thin tunnel dielectric film 204, approximately 60–120 A thick is formed on the channel region of the memory transistor 12/select transistor 14, as shown in FIG. 21.

Figure 22:
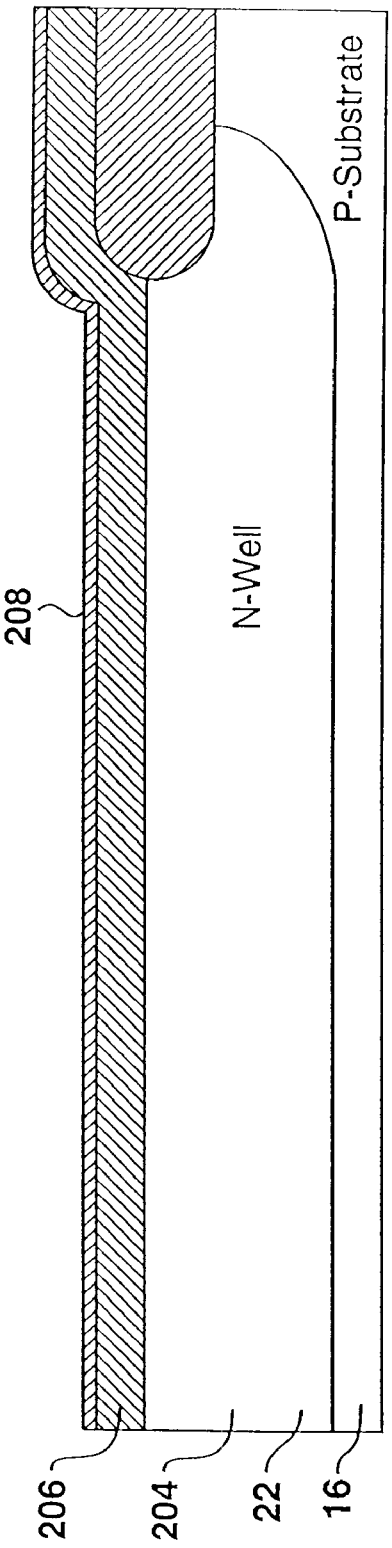

Next, a layer of polysilicon 206 is deposited, which is preferably between approximately 600 and 5000 A thick, as shown in FIG. 22. The polysilicon layer 206 later becomes the floating gate 28 (FIG. 4). Next, the polysilicon layer 206 is doped in the same manner that the polysilicon layer 110 described above is doped. A dielectric layer 208 is then formed over the polysilicon layer 206, as also shown in FIG. 22. Like the dielectric layer 112, the dielectric layer 208, may be formed of one or more layers of material known in the art.

Figure 23:
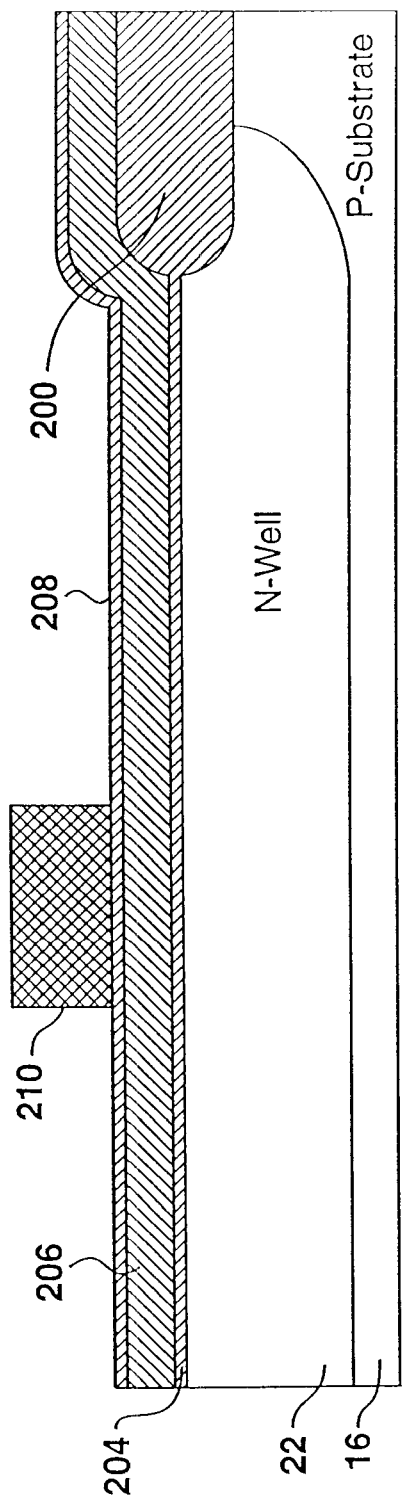
Figure 24:
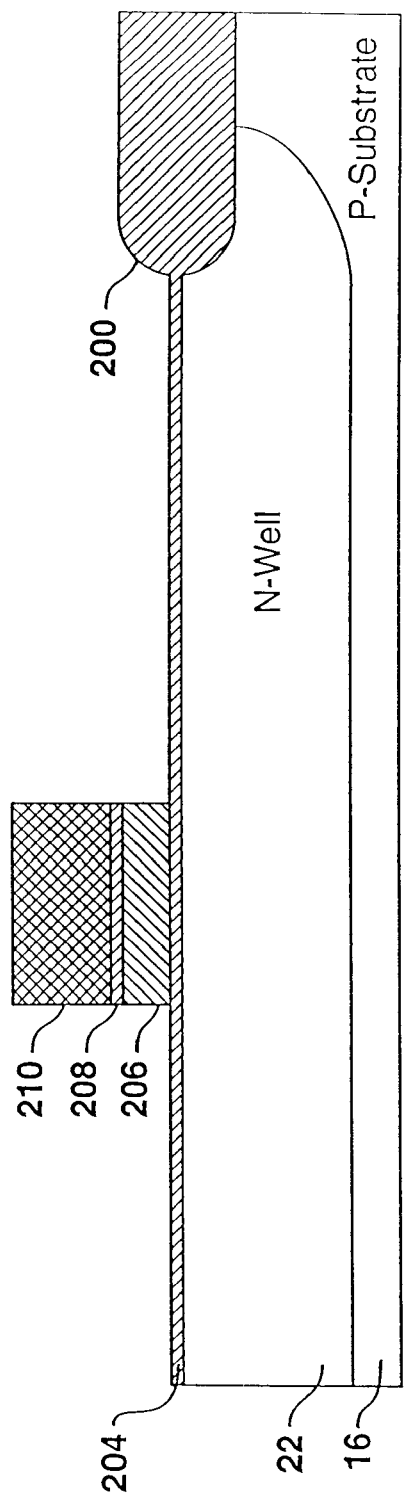

Next, a photoresist layer 210 is deposited on the stack of layers formed, as shown in FIG. 23. The photoresist layer 210 is patterned with a mask and used to define the floating gate 28 (FIG. 4). The stack of layers is then anisotropically etched, preferably using a dry plasma process, down to the tunnel dielectric 204, so as to leave at least a portion of the tunnel dielectric on the channel region, as shown in FIG. 24. The photoresist layer 210 is then removed by a dry plasma or wet chemical etching process, thus leaving a floating gate pattern 28, as shown in FIG. 25.

In the next phase of the process, the threshold voltage adjust implants 34 and 36 are formed. This is accomplished first by depositing a photoresist layer 212 over the peripheral circuitry. A portion or all of the memory array 10, including at least some and possibly all of the individual memory cells 11, is not masked by the photoresist layer 212 during this step, as shown in FIGS. 3 and 26. An n-type dopant 214

Figure 27:
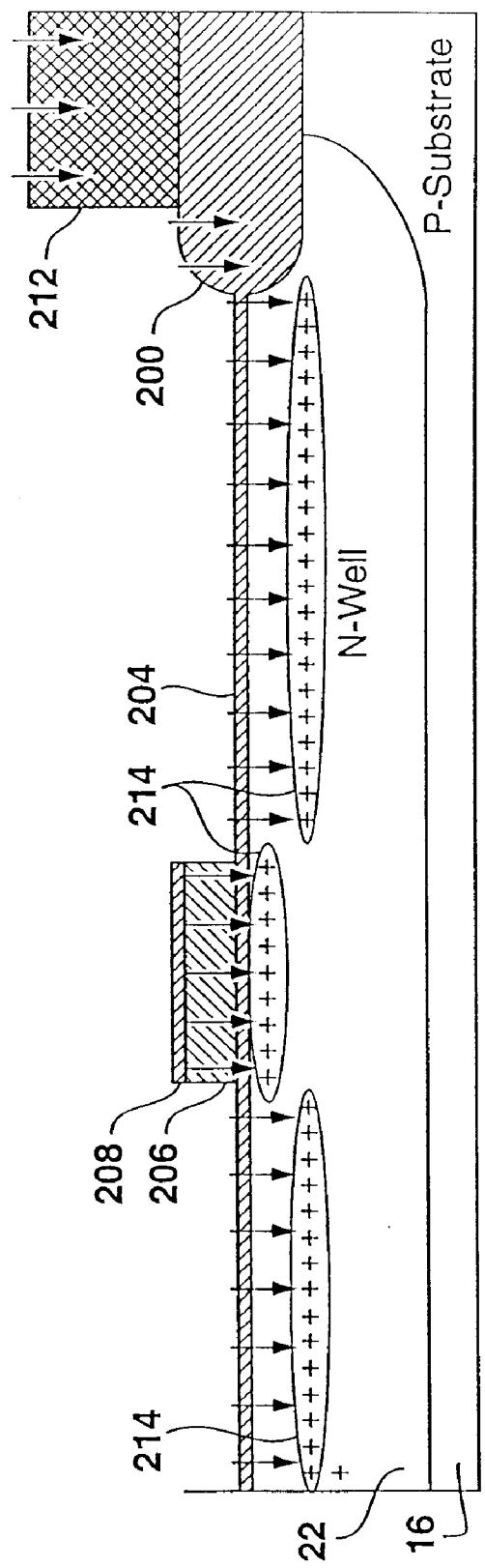

(such as Phosphorus or Arsenic) is then implanted at an energy level sufficient to cause the dopant atoms to penetrate through the dielectric layer 208, the polysilicon layer 206, and the tunnel oxide layer 204 in the cell channel region, as shown in FIG. 27. Outside of the cell channel region, which is covered by the dielectric layer 208 and the polysilicon layer 206, the n-type dopant penetrates much deeper into the silicon substrate, as also shown in FIG. 27. This outside region is the select transistor channel 14 region. Because the n-type dopant in this region is far away from the surface, it has little impact on the select transistor threshold voltage. As explained above, since n-type dopants give up an extra electron when they are incorporated into lattice site in the silicon, they create a positively charged ion core. For this reason, the implanted region is indicated with "+" sign. Also, as in the above described method, the implant dose is preferably in the range of 0 to $5.0 \times 10^{14}$ cm$^{-2}$.

Figure 28:
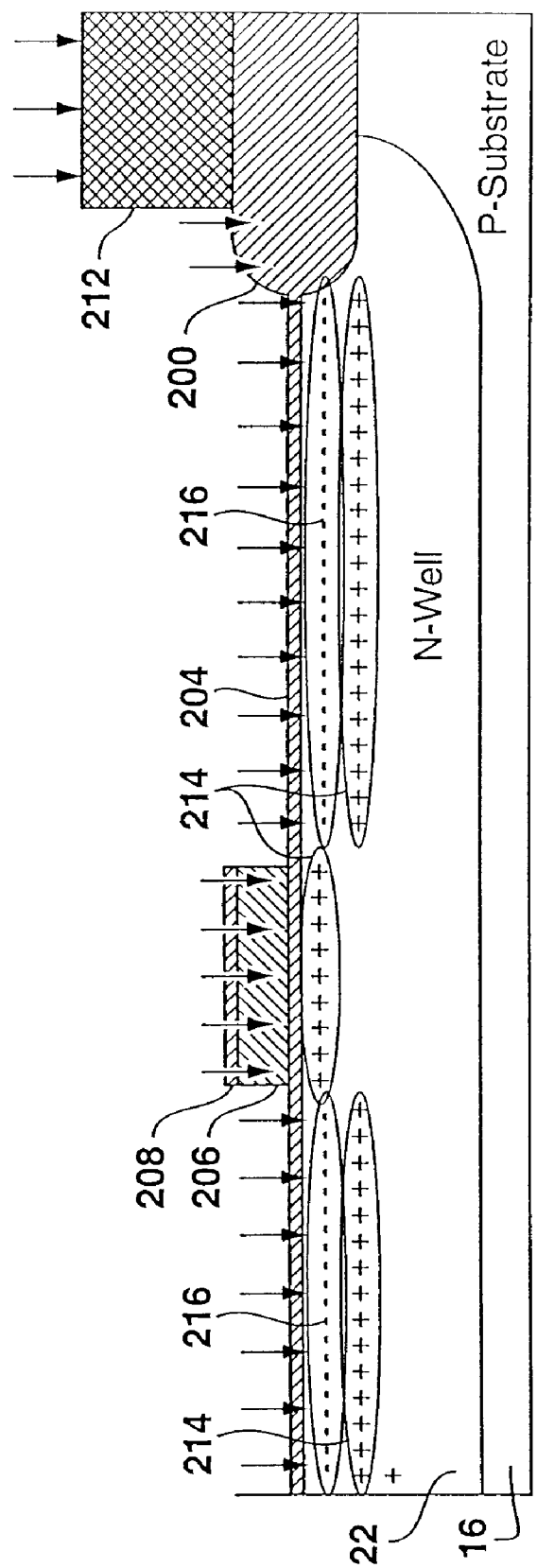
Figure 29:
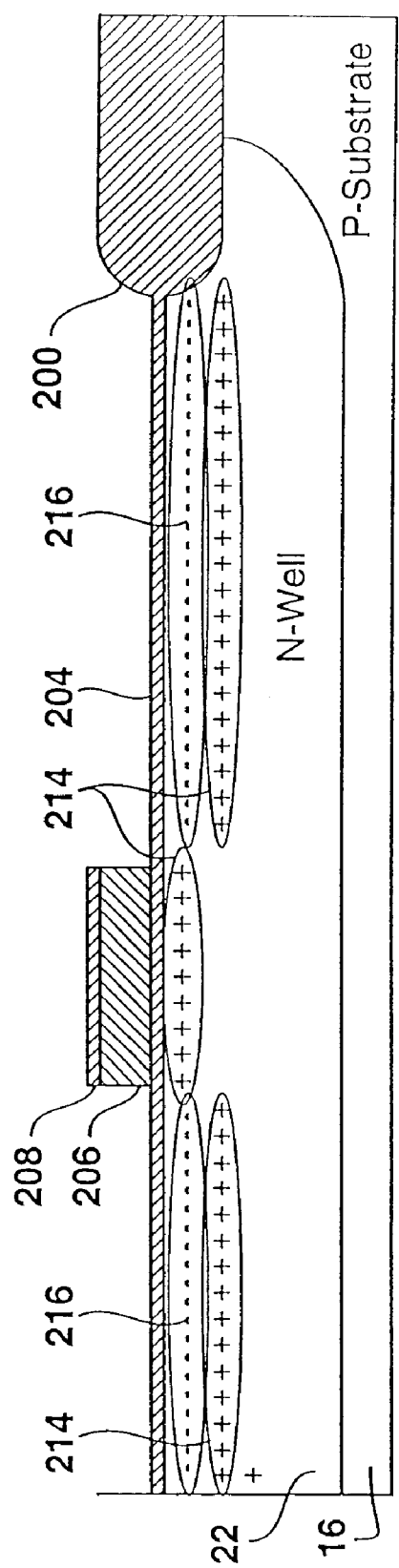

In the next step, the p-type dopant 216 is implanted at a high enough energy to allow the dopant atoms to penetrate the tunnel dielectric layer 204, but not so high as to permit the dopant atoms to penetrate through the dielectric layer 208, the polysilicon layer 206, and the tunnel dielectric 204 in the area defining the memory transistor channel region. Outside of this region, the p-type dopant is able to penetrate the tunnel dielectric 204, as shown in FIG. 28. Again, this latter area defines the select transistor channel region. Because in this region the p-type dopant is close to the surface, it changes the select transistor 14 threshold voltage. Again, as discussed above, since p-type dopants accept an extra electron when they are incorporated into lattice sites in the silicon substrate, they create a negatively charged ion core. For this reason, the implanted region is indicated with "−" sign. Again, the p-type dopants are preferably Boron or BF$_2$, and the implant dose is preferably in the range of 0 to $5.0 \times 10^{14}$ cm$^{-2}$. Next, the photoresist layer 212 is removed by a dry plasma or wet chemical etching process, as shown in FIG. 29.

The shared gate electrode or select gate of the select and memory transistors 30, source and drain regions 18 and 20 of the memory cell 11 (FIG. 4), and metal interconnect are then all formed using techniques well known in the art. Indeed, the exact steps in forming these latter components are not critical to the present invention.

While the embodiments discussed above involve the fabrication of p-channel cells, those of ordinary skill in the art will appreciate, the present invention is equally applicable to n-channel cells. In such an application, the threshold voltage adjusts would be reversed. That is, a p-type of dopant such as Boron or BF$_2$ would be used to form the threshold voltage adjust for the memory transistor 12 (FIG. 4) and an n-type dopant such as Arsenic or Phosphorus would be used to form the threshold voltage adjust for the select transistor 14 (FIG. 4). In addition, those of ordinary skill in the art should appreciate that other process steps (not forming a part of the present invention) are involved in fabrication of a memory cell than those described herein. It should therefore be evident that the particular embodiments disclosed above might be altered or modified and all such variations are considered within the scope and spirit of the invention. Accordingly, the protection sought herein is as set forth in the claims below.

What is claimed is:

1. A method of fabricating a split-gate memory cell having independent threshold voltage adjusts of memory transistor and select transistor, said method comprising the steps of:

forming a floating gate over a portion of a channel region of the substrate;

implanting an n-type dopant at an energy level sufficient to enable the n-type dopant atoms to penetrate through the floating gate and implant themselves in the channel region of the substrate covered by the floating gate, and penetrate into the substrate outside of the floating gate deeply enough to have a negligible effect on the threshold voltage in this region; and implanting a p-type dopant at an energy level sufficient to enable the p-type dopant atoms to implant themselves into the channel region of the substrate outside of the portion of the channel region covered by the floating gate, but not so high as to enable the p-type dopant atoms to penetrate the floating gate and implant themselves in the channel region covered by the floating gate.

2. The method of claim 1, wherein the step of forming the floating gate over a portion of the channel region of the substrate comprise the steps of:

depositing a layer of polysilicon material over the substrate;

placing a protective photoresist layer over a portion of the layer of polysilicon material;

etching away the portion of the layer of polysilicon material not covered by the protective photoresist layer; and removing the protective photoresist layer.

3. The method of claim 1, wherein the step of implanting an n-type dopant includes the step of implanting the n-type dopant at a dose in the range of 0 to $5.0 \times 10^{14}$ cm$^{-2}$ and the step of implanting a p-type dopant includes the step of implanting a p-type dopant at a dose in the range of 0 to $5.0 \times 10^{14}$ cm$^{-2}$.

4. The method of claim 1, wherein the n-type dopant is selected from the group consisting of Arsenic and Phosphorous.

5. The method of claim 1, wherein the p-type dopant is selected from the group consisting of Boron and BF$_2$.

6. The method of claim 3, wherein the step of implanting an n-type dopant includes the step of implanting the n-type dopant at a dose of about $1 \times 10^{13}$ cm$^{-2}$.

7. The method of claim 1, further comprising the step of forming a select gate over the floating gate and a portion of the channel region outside of the floating gate.

8. The method of claim 7, wherein the step of forming the select gate comprises the steps of:

depositing a layer of polysilicon material over the floating gate and substrate;

placing a protective photoresist layer over a portion of the layer of polysilicon material;

etching away the portion of the layer of polysilicon material not covered by the protective photoresist layer; and removing the protective photoresist layer.

* * * * *